(12) United States Patent
McGregor et al.

(10) Patent No.: US 7,778,038 B2
(45) Date of Patent: Aug. 17, 2010

(54) POWER CORE DEVICES AND METHODS OF MAKING THEREOF

(75) Inventors: David Ross McGregor, Apex, NC (US);
Daniel Irwin Amey, Jr., Durham, NC (US); Sounak Banerji, Cary, NC (US);
William J. Borland, Cary, NC (US);
Karl Hartmann Dietz, Raleigh, NC (US); Attiganal N. Sreeram, Raleigh, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 123 days.

(21) Appl. No.: 11/289,961

(22) Filed: Nov. 30, 2005

(65) Prior Publication Data

US 2006/0133057 A1 Jun. 22, 2006

Related U.S. Application Data

(60) Provisional application No. 60/637,817, filed on Dec. 21, 2004.

(51) Int. Cl.
*H05K 1/18* (2006.01)
(52) U.S. Cl. .................. 361/763; 361/761; 361/762; 174/256
(58) Field of Classification Search ............ 361/763, 361/278, 761, 762; 174/250, 258, 262, 256
See application file for complete search history.

(56) References Cited

U.S. PATENT DOCUMENTS

| | | | |
|---|---|---|---|
| 5,010,641 A | 4/1991 | Sisler | |
| 5,079,069 A | 1/1992 | Howard et al. | |
| 5,155,655 A | 10/1992 | Howard et al. | |
| 5,161,086 A | 11/1992 | Howard et al. | |
| 5,162,977 A | 11/1992 | Paurus et al. | |
| 5,428,499 A | 6/1995 | Szerlip et al. | |
| 5,870,274 A | 2/1999 | Lucas | |
| 6,214,445 B1 * | 4/2001 | Kanbe et al. | 428/209 |
| 6,346,743 B1 | 2/2002 | Figueroa et al. | |
| 6,407,929 B1 | 6/2002 | Hale et al. | |
| 6,611,419 B1 | 8/2003 | Chakravorty | |
| 2002/0134581 A1 * | 9/2002 | Figueroa et al. | 174/260 |
| 2006/0138591 A1 * | 6/2006 | Amey et al. | 257/532 |
| 2006/0158828 A1 | 7/2006 | Amey, Jr. et al. | |
| 2006/0180342 A1 * | 8/2006 | Takaya et al. | 174/256 |
| 2007/0090511 A1 | 4/2007 | Borland et al. | |

FOREIGN PATENT DOCUMENTS

| | | |
|---|---|---|
| EP | 0 451 541 A | 10/1991 |
| EP | 1 553 626 A | 7/2005 |

* cited by examiner

*Primary Examiner*—Dean A. Reichard
*Assistant Examiner*—Abiy Getachew

(57) ABSTRACT

The present invention relates to a power core comprising: at least one embedded surface mount technology (SMT) discrete chip capacitor layer comprising at least one embedded SMT discrete chip capacitor; and at least one planar capacitor laminate; wherein at least one planar capacitor laminate serves as a low inductance path to supply a charge to at least one embedded SMT discrete chip capacitor; and wherein said embedded SMT discrete chip capacitor is connected in parallel to said planar capacitor laminate.

12 Claims, 10 Drawing Sheets

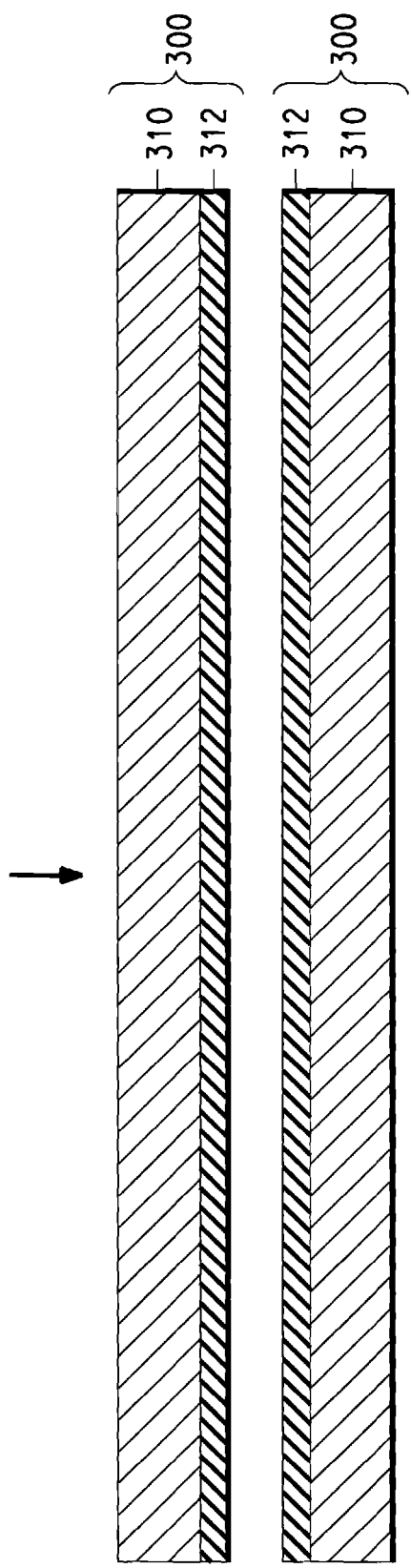
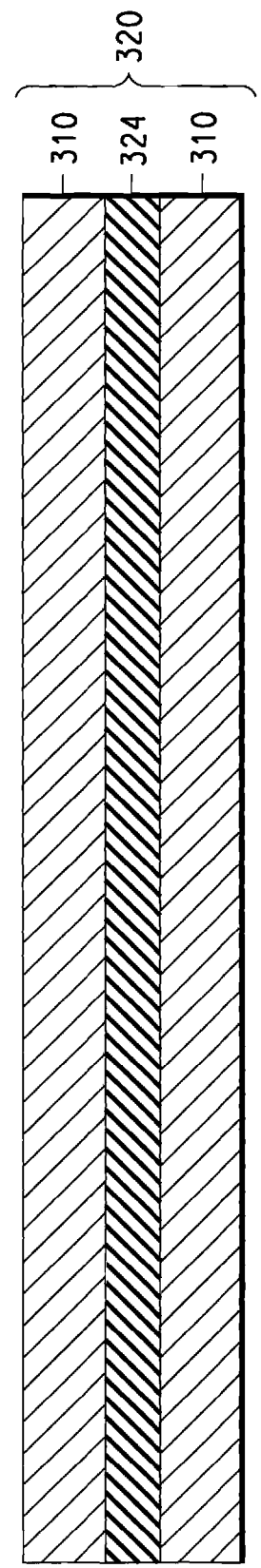
FIG. 4A
FIG. 4B

US 7,778,038 B2

POWER CORE DEVICES AND METHODS OF MAKING THEREOF

TECHNICAL FIELD

The technical field relates to devices having both low inductance and high capacitance functions, and methods of incorporating such devices in organic dielectric laminates and printed wiring boards.

BACKGROUND ART

As semiconductor devices including integrated circuits (IC) operate at higher frequencies, higher data rates and lower voltages, noise in the power and ground (return) lines and supplying sufficient current to accommodate faster circuit switching becomes an increasingly important problem requiring low impedance in the power distribution system. In order to provide low noise, stable power to the IC, impedance in conventional circuits is reduced by the use of additional surface mount technology (SMT) capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will malfunction. Additionally, as the IC powers up, a slow response time will result in power overshoot. Power droop and overshoot must be controlled within allowable limits by the use of capacitors that are close enough to the IC that they provide or absorb power within the appropriate response time.

SMT capacitors for impedance reduction and dampening power droop or overshoot are generally placed on the surface of the board as close to the IC as possible to improve circuit performance. Conventional designs have capacitors surface mounted on a printed wiring board (PWB) clustered around the IC. Large value capacitors are placed near the power supply, mid-range value capacitors at locations between the IC and the power supply and small value capacitors very near the IC. FIG. 1 is a schematic illustration of a power supply 2, an IC 10 and the capacitors 4, 6, 8, which represent high value, mid-range value and small value capacitors, respectively, used for impedance reduction and dampening power droop or overshoot as described above. FIG. 2 is a representative section view in front elevation showing the connections of the SMT capacitors 50 and 60 and IC 40 to the power and ground planes in the substrate of the PWB. IC device 40 is connected to lands 41 by solder filets 44. Lands 41 are connected to plated-through hole via (via) pads of vias 90 and 100 by circuit lines 72 and 73. Via pads are shown generically as 82. Via 90 is electrically connected to conductor plane 120 and via 100 is connected to conductor plane 122. Conductor planes 120 and 122 are connected one to the power side of the power supply and the other to the ground (return) side of the power supply. Small value capacitors 50 and 60 are similarly electrically connected to vias and conductor planes 120 and 122 in such a way that they are electrically connected to IC 40 in parallel. In the case of ICs placed on modules, interposers, or packages, the large and medium value capacitors may reside on the printed wiring mother board to which the modules, interposers, or packages are attached.

Large numbers of SMT capacitors, interconnected in parallel, are often required to reduce power system impedance requiring complex electrical routing. This leads to increased circuit loop inductance, which in turn increases impedance, constraining current flow, thereby reducing the beneficial effects of the surface mounted capacitors. As frequencies increase and operating voltages continue to drop, increased power must be supplied at faster rates requiring increasingly lower inductance and impedance levels.

Considerable effort has been expended to minimize impedance. U.S. Pat. No. 5,161,086 to Howard, et al., provides one approach to minimizing impedance and "noise". Howard, et al. provides a capacitive printed circuit board with a capacitor laminate (planar capacitor) included within the multiple layers of the laminated board, a large number of devices such as integrated circuits being mounted or formed on the board and operatively coupled with the capacitor laminate (or multiple capacitor laminates) to provide a capacitive function employing borrowed or shared capacitance. However, such an approach does not necessarily improve voltage response. Improved voltage response requires that the capacitor is placed closer to the IC. Simply placing the capacitor laminate closer to the IC may not be sufficient because the total capacitance available may be insufficient.

U.S. Pat. No. 6,611,419 to Chakravorty provides for an alternate approach to embedding capacitors to reduce switching noise wherein the power supply terminals of an integrated circuit die can be coupled to the respective terminals of at least one embedded capacitor in a multilayer ceramic substrate.

Accordingly, the present inventors desired to provide a method of making and design of a power core for use in integrated circuit packages or other interconnecting boards, structures or elements that allows for superior power distribution impedance reduction combined with improved voltage response to accommodate higher IC switching speeds. The present invention provides such a device and method of making such a device.

SUMMARY

One embodiment of the present invention is directed to a power core comprising: at least one embedded surface mount technology (SMT) discrete chip capacitor layer comprising at least one embedded SMT discrete chip capacitor; and at least one planar capacitor laminate; wherein at least one planar capacitor laminate serves as a low inductance path to supply a charge to at least one embedded SMT discrete chip capacitor; and wherein said embedded SMT discrete chip capacitor is connected in parallel to said planar capacitor laminate.

The present invention is further directed to a method for making a power core structure comprising: providing a planar capacitor laminate having at least one patterned side; providing a metal foil; laminating said metal foil to the patterned side of said planar capacitor laminate; creating lands and via pads on said metal foil; attaching at least one SMT discrete chip capacitor to said lands on said metal foil; and connecting said at least one SMT discrete chip capacitor in parallel to said planar capacitor laminate.

An additional embodiment of the present invention provides a method for making a power core structure comprising: A method for making a power core structure comprising: providing a planar capacitor laminate having a first patterned side and a second patterned side; providing a metal foil; laminating said metal foil to one said patterned side of said planar capacitor laminate; creating lands and via pads on said metal foil; attaching at least one SMT discrete chip capacitor to said lands on said metal foil; and connecting said at least one SMT discrete chip capacitor in parallel to said planar capacitor laminate.

The present invention is further directed to methods of making a device and a device comprising the above power core structure wherein said power core is interconnected to at least one signal layer.

BRIEF DESCRIPTION OF THE DRAWINGS

The detailed description will refer to the following drawings, wherein like numerals refer to like elements, and wherein:

FIGS. 4A-4B illustrate a method of making a planar capacitor laminate.

DETAILED DESCRIPTION

Embodiments of the present invention are addressed to a power core structure that may be buried in the substrate of a printed wiring board (PWB), module, interposer, or package. Providing the low inductance and high capacitance functions of the power core within the PWB, module, interposer, or package substrate conserves valuable surface real estate on the PWB, module, interposer, or package and also requires fewer solder joints than conventional SMT capacitor arrangements.

According to a first embodiment, a design and manufacturing method of a power core structure is disclosed in which high capacitance value SMT discrete chip capacitor(s) and planar capacitor laminate(s) are connected in parallel embedded within a laminate structure to create a power core structure. SMT discrete chip capacitors are electrically connected to metal lands by soldering or other suitable method. Typically, the metal is a metal foil. Although we use the term "foil" herein, it is understood that foil encompasses a general metal layer, plated metal, sputtered metal, etc. The high capacitance value SMT discrete chip capacitors in the power core structure are located and interconnected to be as close as possible to the power terminals of the IC for a rapid voltage response to the IC to support high switching speeds. Placing the SMT discrete chip capacitors as close as possible to the power terminals of the IC also provides for low inductance connections. The planar capacitor laminate is used as the power-ground planes and the power-ground plane separation is made thin to reduce high frequency impedance in the package.

Figure 1:
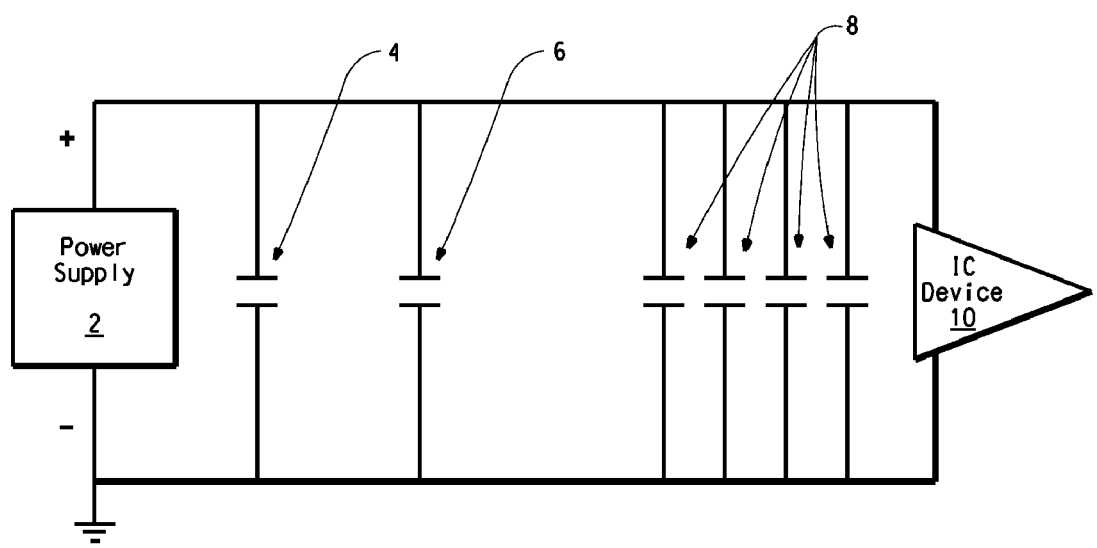
FIG. 1 is a schematic illustration of typical prior art use of capacitors for impedance reduction and dampening power droop or overshoot.
Figure 2:
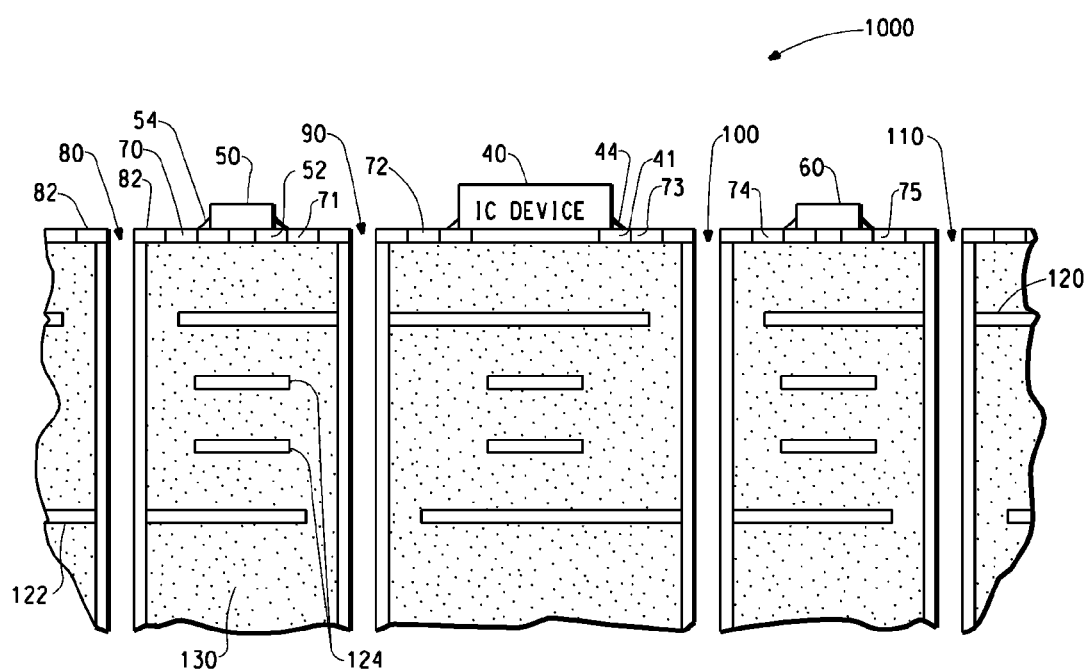
FIG. 2 is a representation in section view in front elevation of a printed wiring assembly having conventional prior art surface mount (SMT) capacitors used for impedance reduction and dampening power droop or overshoot.
Figure 3:
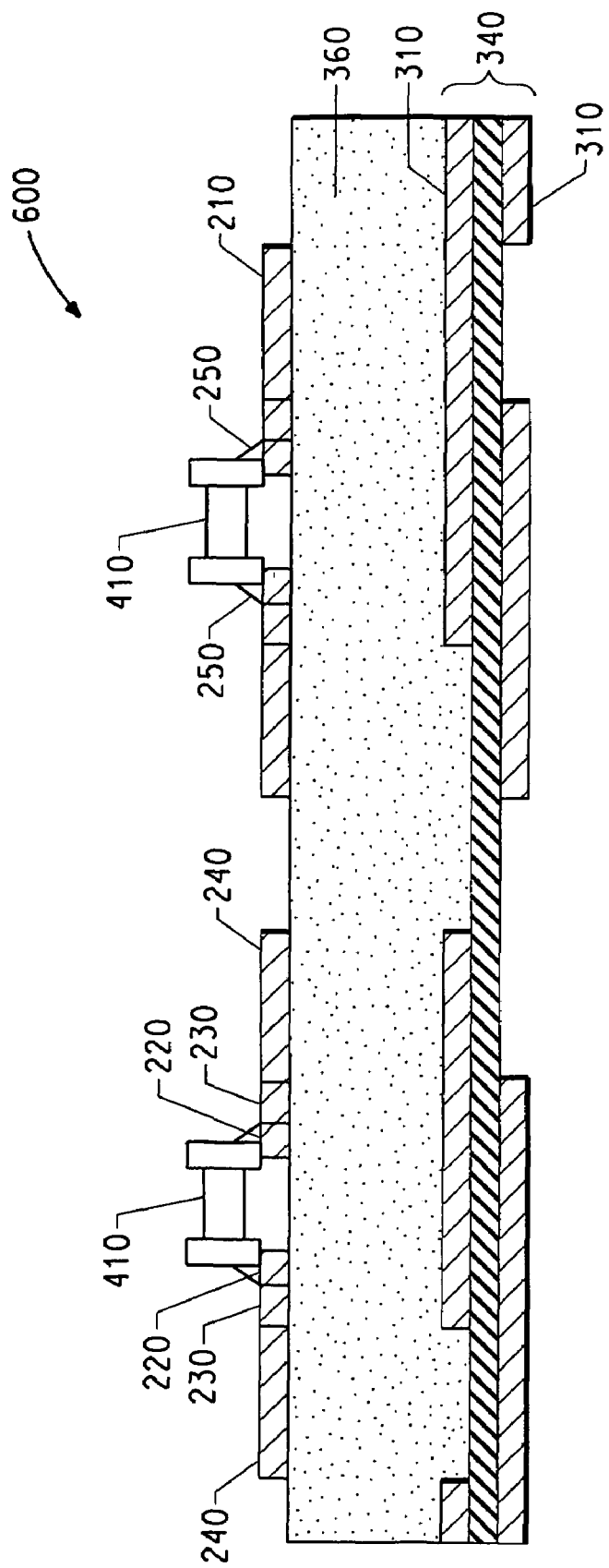
FIG. 3 is a representation in section view in front elevation of a power core structure according to a first embodiment.

FIG. 3 is a representation in section view in front elevation of a power core device 600 of the present invention. The above embodiment allows for a foil 210 to be laminated to the planar capacitor laminate 340, lands 220, circuit conductors 230 and via pads 240 to be formed on the foil and SMT discrete chip capacitors 410 to be soldered to the lands by solder filets 250. Such SMT discrete chip capacitors are common in the industry and may be obtained from, for example, Murata Manufacturing Co., Ltd., Syfer a Dover Company, and Johanson Dielectrics, Inc. The foil used for forming said lands for attaching said SMT discrete chip capacitors may be laminated to the planar capacitor laminate using standard printed wiring board lamination processes to form the power core structure subpart.

The above embodiment also allows for the planar capacitor to be formed using various materials. Such materials may include metal foil-dielectric-metal foil laminate structures wherein the dielectric may comprise an organic layer, a ceramic-filled organic layer, or a ceramic layer. Where multiple layers are used, layers may be of different materials. The thickness of such dielectrics would be thin for impedance reduction. The planar capacitor may be laminated to the foil used for forming said lands for attaching said SMT discrete chip capacitors by standard printing wiring board lamination processes to form the power core device subpart. Attachment of said SMT discrete chip capacitors may be done by applying a solder paste to the lands, placing the SMT discrete chip capacitors on the paste locations and melting the solder paste by solder reflow techniques, for example, to form the power core device. A high temperature solder paste such as Indalloy No. 241 available from Indium Corporation of America may be used to avoid melting of the solder during printed wiring board hot air solder leveling or subsequent assembly soldering.

According to the above embodiment, both the low impedance and high capacitance functions may be integrated into a single power core structure that can be further integrated into another laminate structure, permitting operation of high-speed ICs at lower voltages with reduced voltage ripple and reduced noise. When the power core structure is incorporated in a printed wiring board, module, interposer, or package, valuable real estate becomes available. Further, solder joints associated with multiple SMT capacitors connected in parallel on the surface may be eliminated, thereby improving reliability. The power core structure can be processed using conventional printed wiring board processes, further reducing production costs.

Those skilled in the art will appreciate the above stated advantages and other advantages and benefits of various embodiments of the invention upon reading this detailed description of the embodiments with reference to the below-listed drawings.

According to common practice, the various features of the drawings are not necessarily drawn to scale. Dimensions of various features may be expanded or reduced to more clearly illustrate the embodiments of the invention.

FIG. 3 illustrates, in side elevation, a power core device 600 comprising a planar capacitor laminate 340 and SMT discrete chip capacitors 410 according to a first embodiment.

FIGS. 4A-4B illustrate, in side elevation, a general method of manufacture of a planar capacitor laminate.

FIG. 4A is a section view in front elevation of the first stage of manufacture of a planar capacitor laminate 320, illustrated in FIG. 4B, in which a first metal foil 310 is provided. The foil 310 may be made from, for example, copper, copper-based materials, and other metals. Preferred foils include foils comprised predominantly of copper, such as reverse treated copper foils, double-treated copper foils, rolled annealed copper foils and other copper foils commonly used in the multilayer printed circuit board industry. Examples of some suitable copper foils are those which are available from Olin Brass (Somers Thin Strip) and Gould Electronics. The thickness of the foil 310 may be in the range of, for example, about 1-100 microns, preferably 3-75 microns, and most preferably 12-36 microns, corresponding to between about ⅓ oz and 1 oz copper foil.

A slurry material or a solution may be cast or coated onto foil 310, dried and cured, forming a first dielectric layer 312, the result being a coated metal foil 300. The dielectric layer or layers of the laminate may be selected from organic, ceramic, ceramic filled organic and layers of mixtures thereof. Curing may be performed by baking, for example, at 200-350° C., if the polymer is of a thermoplastic nature. Higher curing temperatures can be used if the polymer is a thermoset material. Curing may be performed by drying, for example, at 120-200° C., if the polymer is intended to be only partially cured to create a "B" stage state of the polymer.

Solutions used to form the dielectric layer 312 may comprise, for example, a polymer dissolved in a solvent. Slurry materials may comprise, for example, a polymer-solvent solution with a high dielectric constant ("high K") filler/ceramic filler or functional phase. Suitable polymers for slurry or solution may include, but are not limited to for example, epoxy or polyimide resins. High K functional phases may be defined as materials with dielectric constants of greater than 500 and may include perovskites of the general formula $ABO_3$. Suitable fillers include, for example, crystalline barium titanate (BT), barium strontium titanate (BST), lead zirconate titanate (PZT), lead lanthanum titanate, lead lanthanum zirconate titanate (PLZT), lead magnesium niobate (PMN), and calcium copper titanate. Fillers may be in powder form. A suitable high K filler phase is barium titanate obtainable from Ferro Corporation, Tam Ceramics or Fuji Titanium.

Functional phases with dielectric constants below 500 may also be appropriate for other reasons. Such materials may include the oxides of titanium, tantalum, hafnium and niobium.

If the dielectric 312 is thermoplastic in nature or only partially cured, two pieces of the coated metal foil 300 may be laminated together under heat and pressure in the direction shown by the arrows in FIG. 4A to form the laminate structure 320 illustrated in FIG. 4B.

If the dielectric 312 is thermoset in nature, a thin adhesive layer may be applied to one or both of the dielectric layers 312. Commercial thermoset dielectrics include polyimide grades available from E. I. du Pont de Nemours and Company.

Referring to FIG. 4B, lamination forms a single dielectric layer 324 from the layers 312. The resulting dielectric 324 can be, for example, a thin layer, on the order of 4-25 microns after lamination. One embodiment of the planar capacitor laminate is a copper-dielectric-copper laminate. Embedded capacitor materials and processes that can be used to form metal-dielectric metal structures include Probelec 81 CFP from Vantico licensed to Motorola and resin coated foil products such as MCF 6000E from Hitachi Chemical Company, MR-600 from Mitsui Metal and Smelting Co., Ltd., R-0880 from Matsushita Electric Works, Ltd., and APL-4000 from Sumitomo Bakelite Co., Ltd.

An alternative method of forming the dielectric layer 324 may be to cast a filled or unfilled thermoplastic polymer onto the foil 310 and to directly laminate a second, uncoated foil to the filled thermoplastic polymer. Yet another alternative method of manufacture includes forming the dielectric layer 324 separately as a single film and laminating it to a first foil 310 and a second foil 310 using heat and pressure. Yet another alternative method of manufacture includes forming the dielectric layer 324 separately as a single film and sputtering a metallic seed layer onto both sides of said separately formed dielectric layer and then plating additional metal onto the seed layer using electroless or electrolytic plating techniques. Suitable capacitor laminates include Interra™ HK 04 Series from E. I. du Pont de Nemours and Company, Interra™ HK 11 Series from E. I. du Pont de Nemours and Company, BC-2000 and BC-1000 from laminators licensed by Sanmina-SCI Corporation, FaradFlex Series from Oak-Mitsui Technologies, InSite™ Embedded Capacitor Series from Rohm and Haas Electronic Materials, TCC™ from Gould Electronics, and C-Ply from 3M.

Figure 5A:
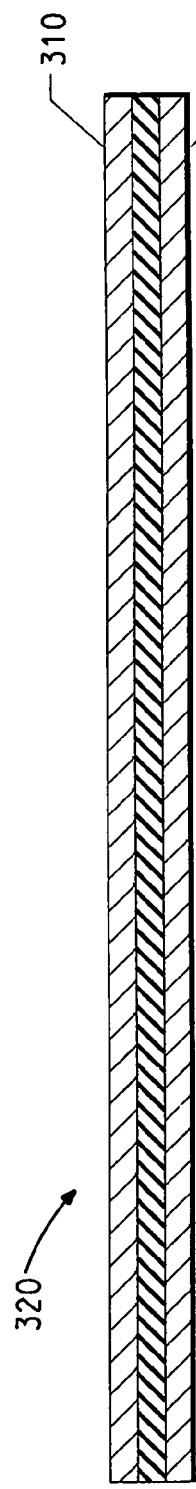
FIGS. 5A-5B illustrate initial preparation of a planar capacitor laminate for manufacture of the power core structure according to a first embodiment.
Figure 5B:
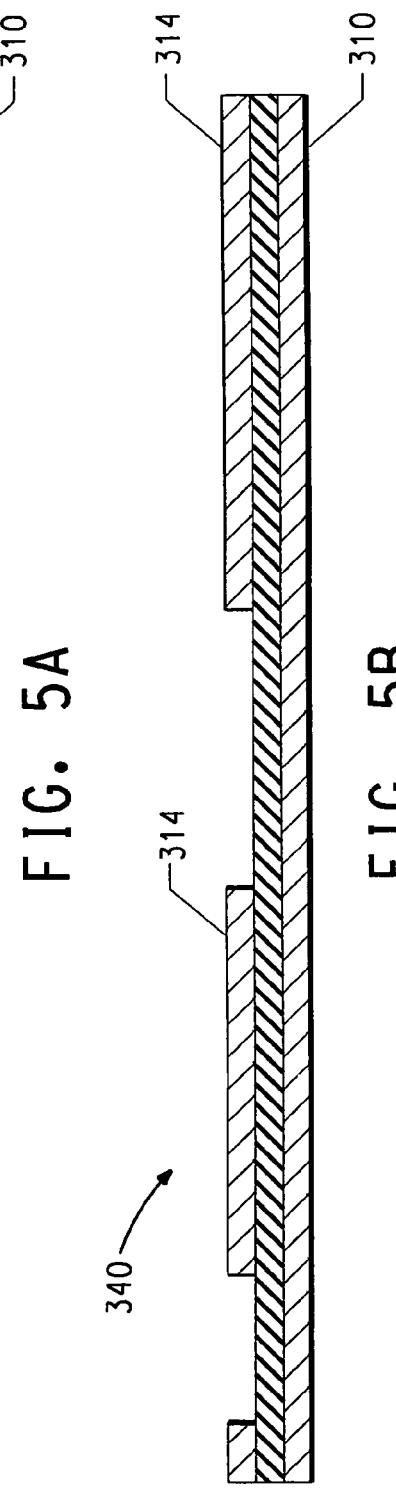

FIGS. 5A-5B illustrate, in side elevation, a general method of preparation of a planar capacitor laminate for manufacture of the power core structure and device.

FIG. 5A shows, in side elevation, the planar capacitor laminate 320 from FIG. 4B. A photoresist (not shown in FIG. 5A) is applied to each of the foils 310. However, only one of the photoresists is imaged and developed so that only one of the foils 310 is etched, creating foil electrode sections 314 and associated circuitry. All remaining photoresist is then stripped using standard printing wiring board processing conditions. An example of a suitable photoresist would be Riston® Photoresist available from E. I. du Pont de Nemours and Company.

FIG. 5B shows, in side elevation, the resulting etched laminate, 340, illustrating one side that has had portions of foil 310 removed by etching while the other foil 310 remains intact.

Figure 6:
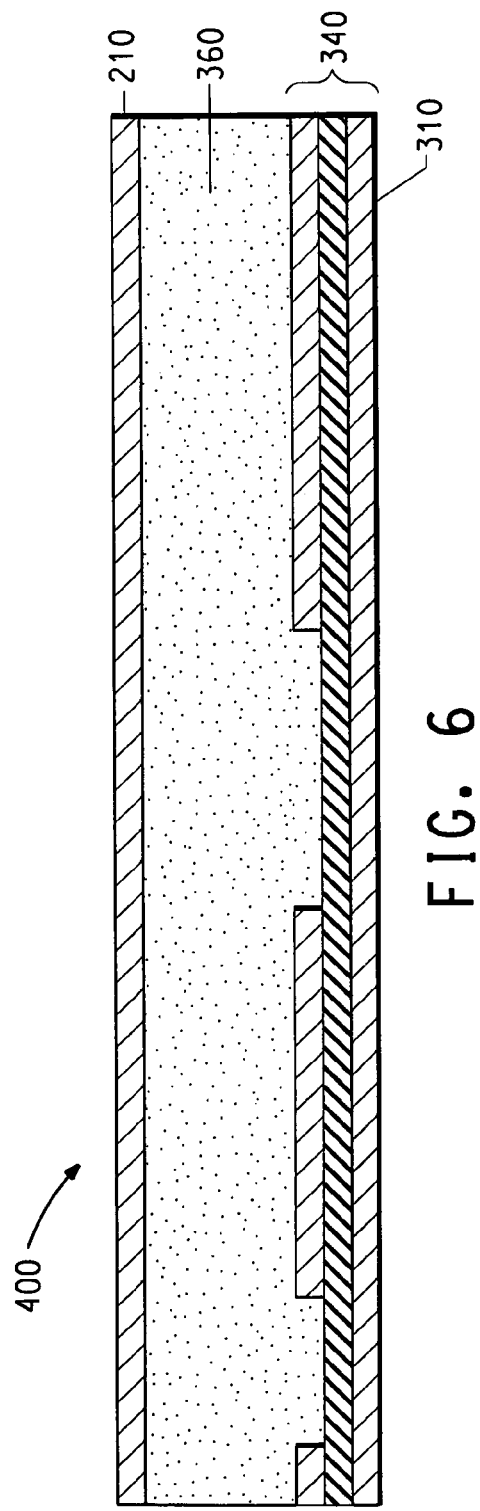
FIG. 6 is a representation in section view in front elevation of a power core structure subpart according to a first embodiment.

Referring to FIG. 6, a foil 210 is laminated to the patterned side of the planar capacitor layer 340. The lamination can be performed, for example, using FR4 epoxy prepreg 360 in standard printing wiring board processes. In one embodiment, epoxy prepreg type 106 may be used. Suitable lamination conditions may be 185° C. at 208 psig for 1 hour in a vacuum chamber evacuated to 28 inches of mercury. A silicone rubber press pad and a smooth PTFE filled glass release sheet may be in contact with the foils 210 and 310 to prevent the epoxy from gluing the lamination plates together. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide insulation. A release sheet may be in contact with the foils to prevent the epoxy from gluing the lamination plates together. The resulting subpart 400 has foil 210 on one side and foil 310 on the other.

Figure 7:
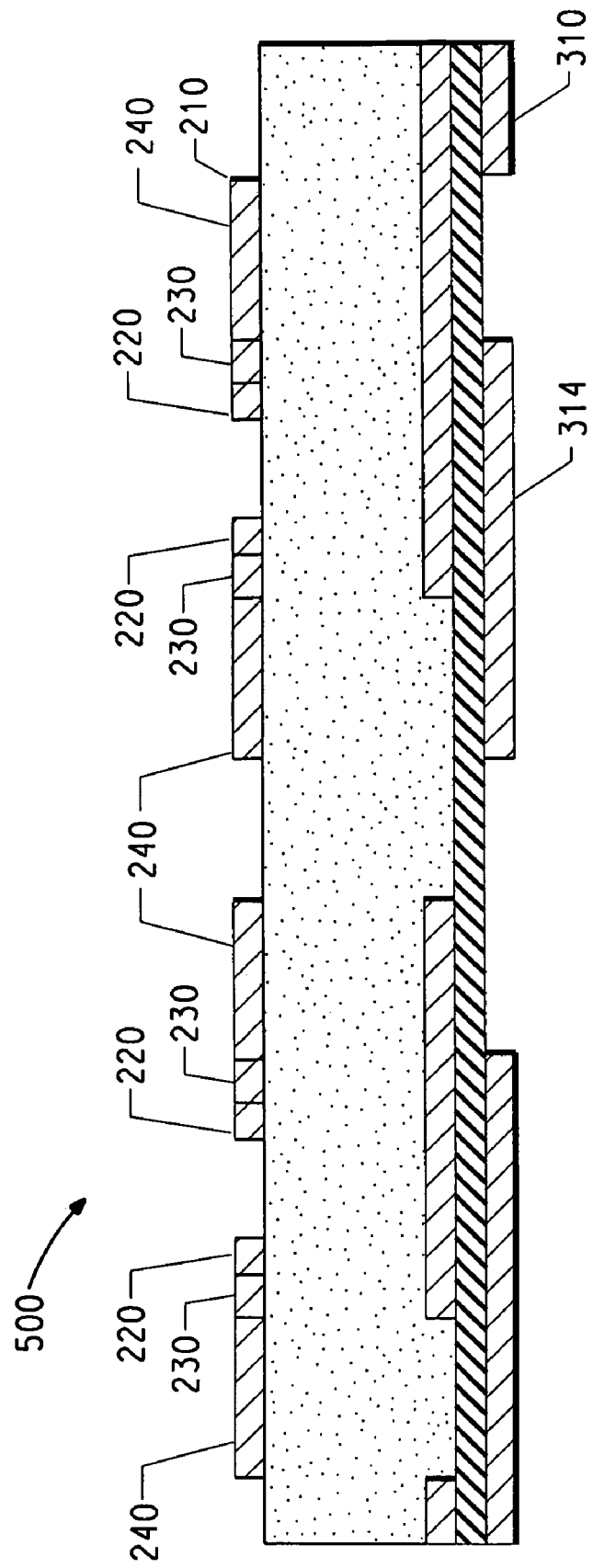
FIG. 7 is a representation in section view in front elevation of a power core structure subpart having undergone further processing according to a first embodiment.

Referring to FIG. 7, after lamination, a photoresist (not shown in FIG. 7) is applied to the foil 210 and the planar capacitor foil 310. The photoresist is imaged and developed, the metal foils are etched and the photoresist is stripped using standard printing wiring board processing conditions. The etching produces foil electrode sections 314 and associated circuitry on the planar capacitor foil 310. The etching also produces lands 220, circuit conductors 230 and via pads 240 from foil 210. Any associated circuitry is also created from foil 210. The resulting subpart 500 is created.

Figure 8:
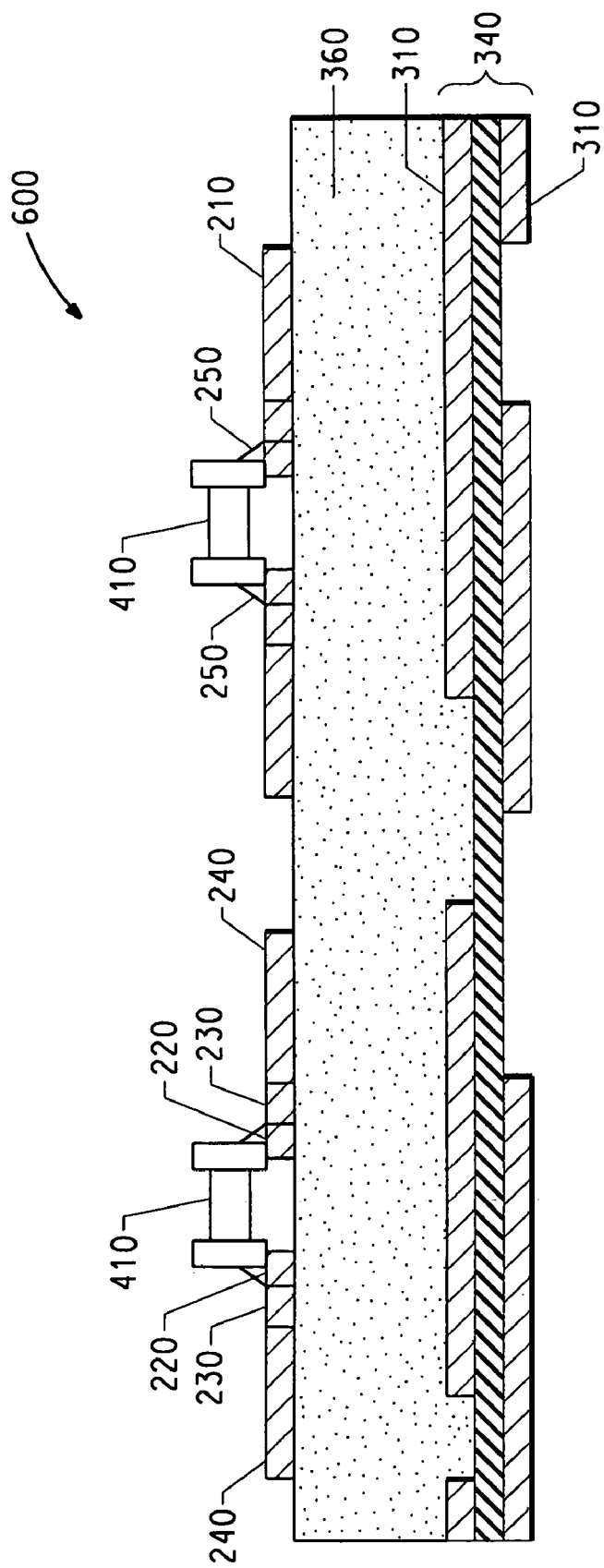
FIG. 8 is a representation in section view in front elevation of a power core structure according to a first embodiment.

Referring to FIG. 8, the power core device 600 is completed by attaching SMT discrete chip capacitors 410 to subpart 500. One method for attaching the SMT capacitors is to apply a high temperature solder paste such as Indalloy No. 241 available from Indium Corporation of America to lands 220. After solder paste application the SMT discrete chip capacitors are placed on the paste-covered lands by pick and place equipment readily available in the printed wiring board assembly industry. The solder paste is reflowed by typical circuit board assembly processes, thereby electrically connecting the SMT discrete chip capacitors to the lands.

It should be understood that the power core may be formed by other sequences of lamination of layers, for example, by first laminating the imaged side of the planar capacitor laminate 340 shown in FIG. 6 to other printed wiring board layers, applying photoresist to the unimaged foil 310, etching the foil, stripping the photoresist, and then laminating foil 210 to the resulting structure.

Figure 9:
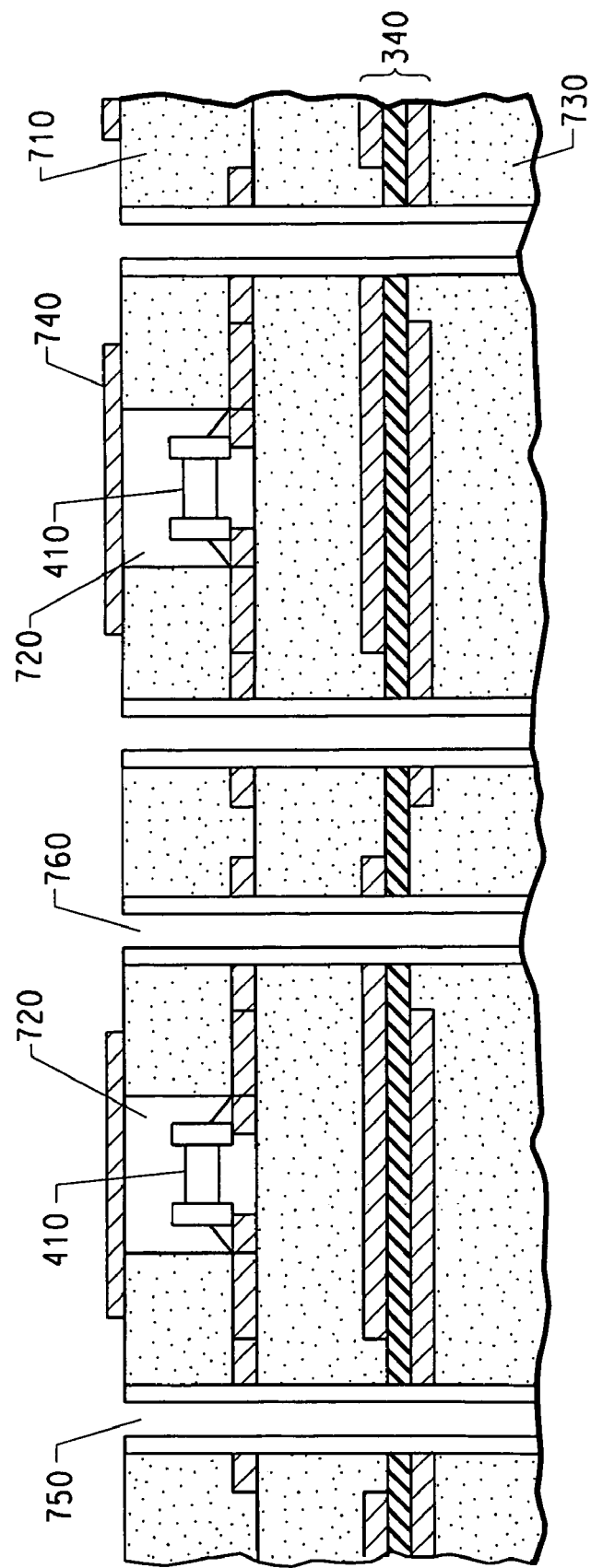
FIG. 9 is a representation in section view in front elevation of a power core structure of a next stage in the incorporation of the power core into a printed wiring board, module (including a multichip module), interposer or package (including area array package, system-on-package, system-in-package) to form a power core device.

FIG. 9 shows, in side elevation, a further stage in processing the power core to incorporate it into a printed wiring board, module, interposer or package. The power core device 600 may be laminated to other circuit layers using, for example, FR4 epoxy prepreg 710 and 730 in standard printing wiring board processes. Prepreg 710 may be pre-punched, creating openings 720. A metal foil 740 may also be laminated with prepreg 710 and be appropriately imaged to create desired circuitry. Openings 720 serve to reduce pressure on SMT discrete capacitors 410 during the lamination process. The epoxy in the prepreg flows around capacitors 410 during lamination, encapsulating them (not shown in the drawing for clarity). Additional circuit layers may also be laminated. An additional method could use a resin coated metal foil, the dielectric of which contains no glass reinforcement fiber. The resin, being only partially cured, flows around the SMT discrete capacitors 410 during the lamination process.

Electrical connections of the of the planar capacitor foil electrode sections 312 and 314 to via pads 240 may be provided by drilling and plating plated through-hole vias or by other techniques common in the printed wiring board industry. FIG. 9 shows a representation of portions of plated through-hole vias 750 and 760. Plated through hole via 750 is electrically connected to one terminal of the SMT discrete chip capacitor 410 and one foil of planar capacitor 340. Plated through hole via 760 is electrically connected to the opposite terminal of the SMT discrete chip capacitor 410 and the opposite foil of planar capacitor 340. This representation shows a parallel electrical connection between SMT discrete chip capacitor 410 and planar capacitor laminate 340.

FIG. 9 depicts one embodiment of a power core device. The power core device comprises a power core wherein said power core comprises: at least one embedded surface mount technology (SMT) discrete chip capacitor layer comprising at least one embedded SMT discrete chip capacitor; and at least one planar capacitor laminate; wherein at least one planar capacitor laminate serves as a low inductance path to supply a charge to at least one embedded SMT discrete chip capacitor; and wherein said embedded SMT discrete chip capacitor is connected in parallel to said planar capacitor laminate; and wherein said power core is interconnected to at least one signal layer.

The SMT discrete chip capacitor of the device comprises at least a first and a second electrode. The first electrode and second electrode are connected to at least one power terminal of a semiconductor device. The semiconductor device may be an integrated circuit.

Furthermore, the power core device may comprise more than one signal layer wherein said signal layers are connected through conductive vias. The device may be selected from an interposer, printed wiring board, multichip module, area array package, system-on-package, and system-in-package, and other like devices known to those skilled in the art.

The power core device may be formed by various methods including a method for making a device comprising: providing a planar capacitor laminate having at least one patterned side; providing a metal foil; laminating said metal foil to the patterned side of said planar capacitor laminate; creating lands and via pads on said metal foil; attaching at least one SMT discrete chip capacitor to said lands on said metal foil; connecting said at least one SMT discrete chip capacitor in parallel to said planar capacitor laminate forming a power core; and forming at least one signal layer onto said power core.

A further method for making the device comprises: providing a planar capacitor laminate having a first patterned side and a second patterned side; providing a metal foil; laminating said metal foil to one said patterned side of said planar capacitor laminate; creating lands and via pads on said metal foil; attaching at least one SMT discrete chip capacitor to said lands on said metal foil; connecting said at least one SMT discrete chip capacitor in parallel to said planar capacitor laminate forming a power core; and forming at least one signal layer onto said power core.

These signal layers may be formed by applying a dielectric layer to one or both surfaces of said power core; forming circuitry comprising one or more signal lines on said dielectric layer; and forming a conductive interconnection between layers comprising said signal lines. The interconnection between layers may be a conductive via. Additionally, passive components may be connected to and external to the power core.

EXAMPLES

A structure containing planar capacitance laminates and discrete embedded ceramic capacitors was designed and tested. The planar capacitance laminates formed power distribution planes and the embedded capacitors were designed for placement on two internal metal layers. There were three different capacitor designs: Type A, Type B, and Type C. For each type, multiple capacitors with 1 mm$^2$, 4 mm$^2$, and 9 mm$^2$ effective capacitor size (area) were placed on each of the two internal metal layers. The capacitor designs differed in the relative position and size of the foil electrodes, the size of the dielectric, and the size of the screen printed copper electrode. They further differed in the design of the clearance (gap) that insulates the two copper foil electrodes, and they differed in the location and number of vias that connect the embedded capacitor to the next metal layer above. For example, in the 9 mm$^2$ size capacitors, Type A design featured 4 via connections, Type B had 28 vias, and Type C had 52 vias. For all three types the screen printed conductor formed one electrode of the capacitor and the foil, separated by the dielectric from the screen printed conductor, served as the other capacitor electrode.

Figure 10:
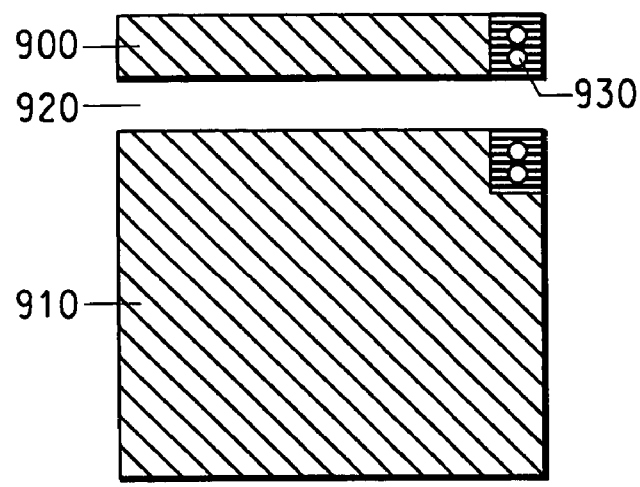
FIG. 10 is a Type A discrete capacitor design viewed from the foil side.

The Type A discrete capacitor design shown in FIG. 10, when viewed from the foil side, had a square form factor with the foil electrode (900) connecting to the screen printed conductor extending across the width of the capacitor. This electrode was separated from the second foil electrode (910)

serving as the other capacitor electrode by a 250 micron gap (920). This gap extended across the width of the capacitor. This second foil electrode extended across the width of the capacitor with a length about ⅘ths of the capacitor length. Via connections (930), 150 microns in diameter were formed to the next metal layer above the capacitor and were placed in the upper right corner, when viewed from the foil side, of each of the two electrodes. For all sizes two vias were used in each electrode.

Figure 11:
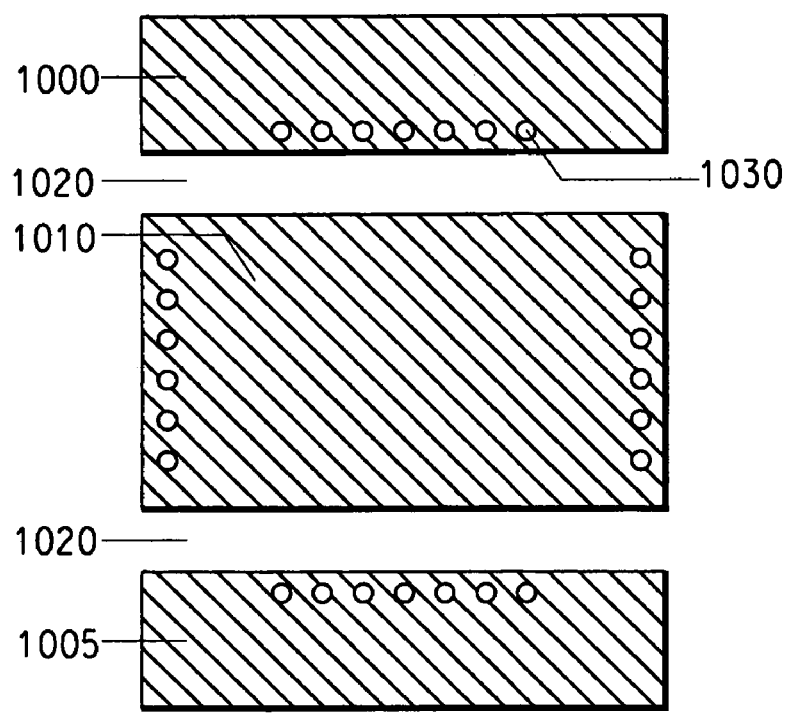
FIG. 11 is a Type B discrete capacitor design viewed from the foil side.

The Type B discrete capacitor design shown in FIG. 11, when viewed from the foil side, had a square form factor with two foil electrodes (1000, 1005) connected to the screen printed conductor. Each electrode extended across the width of the capacitor at the top and bottom of the capacitor, each about ⅕ the length of the capacitor in length. These electrodes were separated from the second foil electrode (1010) serving as the other capacitor electrode by 250 micron gaps (1020) extending across the width of the capacitor. This second electrode (1010) was slightly less than ⅗ths the length of the capacitor in length. Via connections (1030), 150 microns in diameter were formed to the next metal layer above the capacitor and were uniformly placed in a row across the width of the capacitor electrodes at the top and bottom of the capacitor, connecting to the screen printed conductor. The second electrode of the capacitor had a row of vias along the length of each side of the capacitor. For the 9 mm² size, twenty-eight vias were used.

Figure 12:
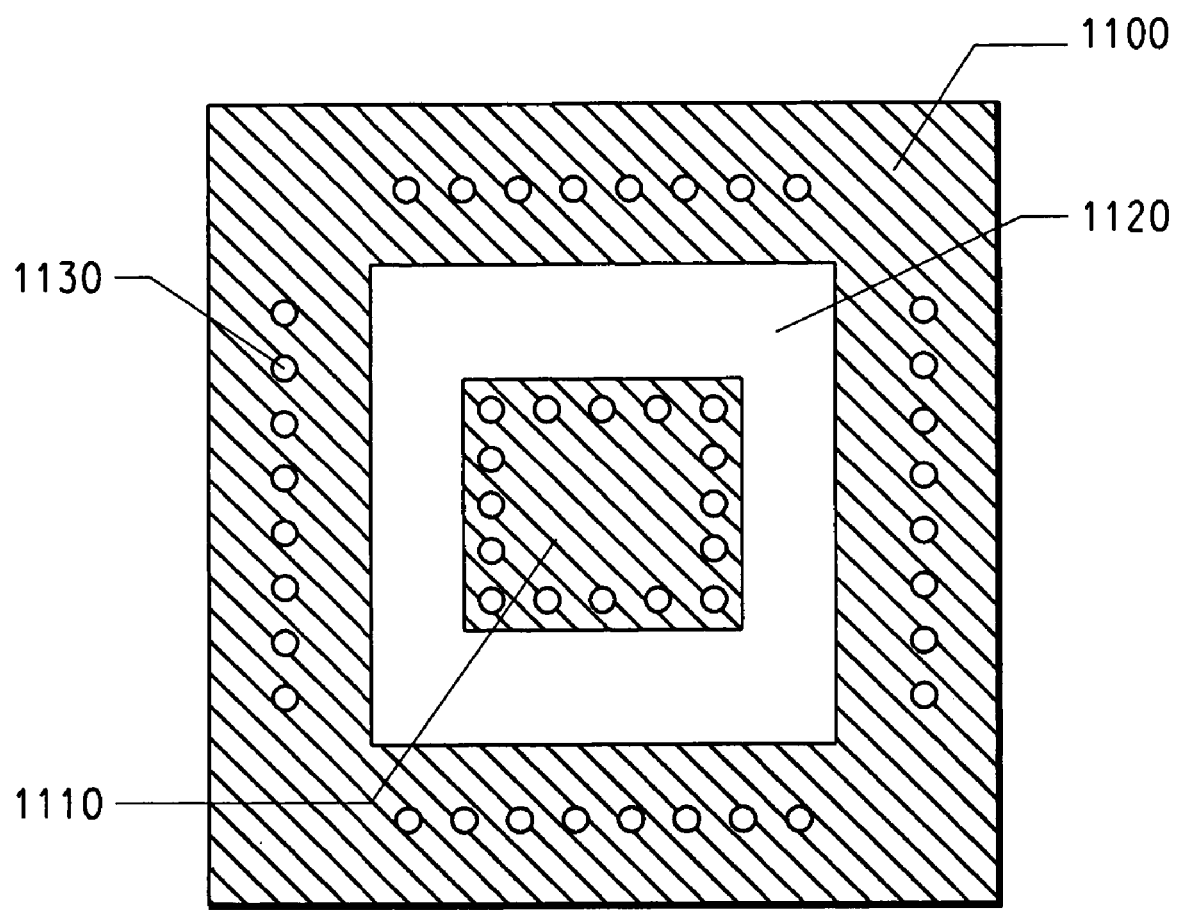
FIG. 12 is a Type C discrete capacitor design viewed from the foil side.

The Type C discrete capacitor design shown in FIG. 12, when viewed from the foil side, had a square form factor. The foil electrode (1100) connected to the screen printed conductor formed a square "picture frame" like feature around the second capacitor electrode (1110). This second capacitor electrode was also square and was separated from the surrounding first electrode by a continuous 250 micron gap (1120). The 150 micron diameter via connections (1130) to the next metal layer above the capacitor were uniformly placed on all four sides of the first capacitor electrode connected to the screen printed conductor, a total of 32 vias for the 9-mm² size. The second electrode of the capacitor had 20 vias for the 9-mm² size, uniformly placed around the perimeter of the electrode.

The electrical parameters (capacitance, resistance, inductance) of individual capacitors, with and without via connections, were measured. The impedance vs frequency response for individual capacitors was measured and the measured responses were compared with the curves generated by a simulation model. The model was then used to simulate the impedance of several capacitor arrays, applying conservative, as well as, advanced design rules for the embedded capacitor arrays.

Results:

The capacitance, resistance, and inductance for Type A, B, and C type capacitors of 1, 4, and 9 mm² size, without via connections were measured using a Vector Network Analyzer and a two port measurement methodology using SOLT calibration. Coaxial style ground—signal probes with 500 micron spacing were used to measure capacitor S parameters and the real and imaginary impedance components of the capacitors were calculated. In Table 1 (without vias) and Table 2 (with vias), Capacitors 1, 4 and 9 are of the Type A design, Capacitors 2, 5 and 8 are of the Type B design and Capacitors 3, 6 and 7 are of the Type C design. Capacitors 1 through 3 were 1 mm×1 mm in size, capacitors 4 through 6 were 2 mm×2 mm in size, and capacitors 7 through 9 were 3 mm×3 mm in size.

TABLE 1

WITHOUT VIAS

|  | CAPACITANCE | ESR (RESISTANCE) | INDUCTANCE |
|---|---|---|---|
| CAPACITOR 1 | 1.26 nF | 36 mohms | 48 pH |
| CAPACITOR 2 | 1.17 nF | 50 mohms | 47.3 pH |
| CAPACITOR 3 | 1.63 nF | 34 mohms | 41.6 pH |
| CAPACITOR 4 | 5.15 nF | 8 mohms | 33.7 pH |
| CAPACITOR 5 | 5.16 nF | 10.7 mohms | 35.07 pH |
| CAPACITOR 6 | 6.16 nF | 10.7 mohms | 35.48 pH |
| CAPACITOR 9 | 10.6 nF | 7.9 mohms | 35.44 pH |
| CAPACITOR 8 | 11 nF | 10 mohms | 40 pH |
| CAPACITOR 7 | 13.6 nF | 8.9 mohms | 33.8 pH |

This shows that the capacitance increases with size, as expected, and does not vary much with the design type. Inductance values of all three types, without via connections, are fairly similar. The same parameters for capacitors of Type A, B, and C with via connections were measured using the same equipment and methodology.

TABLE 2

WITH VIAS

|  | CAPACITANCE | ESR (RESISTANCE) | INDUCTANCE |
|---|---|---|---|
| CAPACITOR 1 | 1.05 nF | 89 mohms | 382 pH |
| CAPACITOR 2 | 1.20 nF | 86.5 mohms | 125 pH |
| CAPACITOR 3 | 1.7 nF | 37.1 mohm | 74.6 pH |
| CAPACITOR 4 | 6.49 nF | 50.1 mohms | 308 pH |
| CAPACITOR 5 | 5.28 nF | 128 mohms | 120.5 pH |
| CAPACITOR 6 | 6.6 nF | 20.9 mohms | 65.17 pH |
| CAPACITOR 9 | 15.3 nF | 100 mohms | 218.2 pH |
| CAPACITOR 8 | 13.26 nF | 15.4 mohm | 115 pH |
| CAPACITOR 7 | 13.2 nF | 17.3 mohms | 79.39 pH |

The data showed that the capacitor type and the number of vias and their location greatly affects the resistance and inductance of the capacitor.

The impedance vs frequency response for two Type C capacitors with and without via connections were measured. For capacitor 3, listed above, the results showed an impedance of about 30 milliohms for the conditions both with and without vias and a resonance frequency shift due to the via connections from about 900 MHz for the capacitor without vias to about 500 MHz with vias. For capacitor 6 without vias the results showed an impedance of about 10 milliohms at a resonant frequency of about 350 MHz and for the condition with vias an impedance of about 20 milliohms at a resonant frequency of about 200 MHz Good correlation between the measured frequency response and the modelled response for the two capacitor types of different sizes was observed.

Simulation of the planar capacitor impedance vs frequency response for the planar capacitor with and without the contribution of the through-hole inductance was performed. The area of the through-hole interconnections was about 1% of the total area. The frequency response of one planar capacitor without the through-hole inductance had an impedance of about 80 milliohms at a resonant frequency of about 300 MHz while the frequency response with two planar capacitors with the through-hole inductances had an impedance of about 30 milliohms at a resonant frequency of about 250 MHz.

Based on the measured results and modelling results of the various individual capacitors, modeling and simulation for an array of 64 discrete embedded capacitors applying a conservative design rule of a minimum spacing between capacitors of 500 μm was performed. Capacitors of different sizes and different resonance frequencies were selected so that the capacitor array impedance response yielded fairly uniform, low impedance values. The impedance achieved in the 100 MHz to 1 GHz range was less than about 40 mΩ.

Based on measured and modeled results applying more demanding spacing design rules for an array of 1.15 to 2.5 mm per side sized capacitors an impedance of 0.7 mΩ was achieved in the 100 MHz to 1 GHz frequency range.

A simulation model for 100 uncoupled transmission lines routed on a 38-micron thick substrate with a relative dielectric constant of 3.8 separated from a power plane was designed. The transmission lines were spaced 10 mils apart, were 15 mm long, 2.82 mils in width and each line was terminated with 99 ohm resistors to the power and to the ground plane (a 50 ohm line termination). In one case the power plane was on a 14-micron thick substrate opposite a ground plane. The substrate having a relative dielectric constant of 3.8 and a Loss Tangent of 0.02. In another case the power plane was on a 14 micron thick substrate opposite the ground plane with a relative dielectric constant of 11 and a Loss Tangent of 0.02. Output drivers producing a 5 GHz square wave bit stream with 80 pS pulse width with 20 pS rise and fall times were used to drive all 100 transmission lines and the "eye" pattern response of a centrally located transmission line was obtained. The eye pattern for the first case, a power plane substrate with a dielectric constant of 3.8, the resulting eye opening height was 2.4799 Volts. In the response for the second case with the same conditions and a power plane substrate with a dielectric constant of 11 the eye opening height was 2.6929 Volts, a significant improvement over the first case. The spacing between the transmission lines was changed to 3 mils resulting in 50 coupled line pairs. With all other conditions remaining the same the eye pattern response was obtained. The eye pattern for this first coupled line case, a power plane substrate with a dielectric constant of 3.8, resulted in an eye opening height of 2.5297 Volts. The response for the second coupled line case with the same conditions and a power plane substrate with a dielectric constant of 11 the eye opening height was 2.6813 Volts, an improvement over the first case. The higher dielectric constant power plane substrate again resulted in an improved eye pattern response.

A simulation model for a configuration that included discrete decoupling capacitors in addition to the planar power plane substrates for the analysis of simultaneous switching noise (SSN) was constructed. This simulation model had 50 coupled transmission line pairs on a 38 micron thick substrate with a relative dielectric constant of 3.8 separated from a power plane. The transmission lines were spaced 3 mils apart, were 15 mm long, 2.82 mils in width and each line was terminated with 99 ohm resistors to the power and ground planes (a 50 ohm line termination). In some cases the power plane was on a 14 micron thick substrate opposite a ground plane. The substrate had a relative dielectric constant of 3.8 and a Loss Tangent of 0.02. In other cases the power plane was on a 14 micron thick substrate opposite the ground plane with a relative dielectric constant of 11 and a Loss Tangent of 0.02. Output drivers producing a 5 GHz square wave bit stream with 80 pS pulse width with 20 pS rise and fall times were used to drive all 100 transmission lines simultaneously and the noise voltage produced on the power plane was obtained. Variations in the type, SMT or embedded discrete, and quantity of capacitors were analyzed. The capacitors were located in an area at the driver or near end of the transmission lines.

In one case a configuration having 50 pairs of coupled lines (100 lines total), twenty-five SMT capacitors were placed at the driver end of the transmission line at every other line pair starting at line pair 1, the next at line pair 3 and ending at line pair 50. The planar power plane substrate had a dielectric constant of 3.8. Each SMT capacitor had a capacitance of 100 nF, an equivalent series inductance (ESL) of about 205 pH and an equivalent series resistance (ESR) of 100 milliohms. A 5 GHz square wave bit stream with 80 pS pulse width with 20 pS rise and fall times was used to drive all 100 transmission lines simultaneously and the noise voltage on the power plane was measured. This was duplicated for embedded discrete capacitors where each capacitor had a capacitance of 1 nF, an equivalent series inductance (ESL) of about 33 pH and an equivalent series resistance (ESR) of 9 milliohms. The planar power plane substrate in this configuration had a dielectric constant of 11. The voltage variation on the power plane for the 25 SMT capacitors with a planar power plane substrate dielectric constant of 3.8 had peak to peak voltage variation of about −0.1 Volts to +0.15 Volts while the voltage variation on the power plane for the 25 embedded discrete capacitors with a planar power plane substrate dielectric constant of 11 had a peak-to-peak voltage variation on the power plane of about −0.05 Volts to +0.05 Volts. A significant reduction in power plane noise produced by the simultaneous switching of output drivers resulted from the use of embedded capacitors and a higher dielectric constant planar power plane substrate.

Additional SMT capacitors were added to the SMT model to determine the number of SMT capacitors that would provide the equivalent noise reduction of the embedded capacitor configuration. Fifty, seventy-five and one hundred SMT capacitors were modeled. The fifty SMT capacitor configuration was achieved by placing capacitors at the driver end of every line pair. The seventy-five capacitor configuration was achieved by adding a second group of capacitors each located at the driver end of every other line pair and the one hundred capacitor configuration was achieved by adding SMT capacitors to produce a two by fifty array of capacitors at the driver end of the first pair thru $50^{th}$ pair of transmission lines.

The voltage variation on the power plane for fifty SMT capacitors and a planar substrate dielectric constant of 3.8 had a peak-to-peak voltage variation on the power plane of about −0.12 Volts to +0.12 Volts. The voltage variation on the power plane for seventy-five SMT capacitors and a planar substrate dielectric constant of 3.8 had a peak-to-peak voltage variation on the power plane of about −0.1 Volts to +0.1 Volts. The voltage variation on the power plane for one hundred SMT capacitors and a planar substrate dielectric constant of 3.8 had a peak-to-peak voltage variation on the power plane of about −0.075 Volts to +0.1 Volts. All four of the SMT capacitor configurations resulted in higher power plane noise, or voltage variation, as a result of simultaneous switching of output drivers than the embedded discrete capacitor configuration with twenty-five capacitors and a power plane dielectric constant of 11.

What is claimed is:

1. A device having a semiconductor device with power terminals mounted thereon, and having a power core incorporated therein, said power core comprising:
   a planar capacitor laminate;
   a layer of a prepreg; and
   a surface mount technology (SMT) discrete chip capacitor embedded in said prepreg layer, wherein said embedded surface mount technology (SMT) discrete chip capacitor is encapsulated within said prepreg layer, and wherein said surface mount technology (SMT) discrete chip capacitor comprises at least a first electrode and a second electrode;

wherein said planar capacitor laminate serves as a low inductance path to supply a charge to said surface mount technology (SMT) discrete chip capacitor;

wherein said embedded surface mount technology (SMT) discrete chip capacitor is connected in parallel to said planar capacitor laminate, and wherein said first electrode and second electrode of said surface mount technology (SMT) discrete chip capacitor are connected to at least one power terminal of the semiconductor device; and wherein said embedded surface mount technology (SMT) discrete chip capacitor is closer to power terminals of the semiconductor device than is said planar capacitor laminate.

2. The power core of claim 1 wherein said planar capacitor laminate comprises a ceramic dielectric layer.

3. The device of claim 1 wherein the semiconductor device is an integrated circuit.

4. The device of claim 1 comprising more than one signal layer wherein said signal layers are connected through conductive vias.

5. The device of claim 1 wherein said device is selected from an interposer, printed wiring board, multichip module, area array package, system-on-package, and system-in-package.

6. The device of claim 1 wherein said planar capacitor laminate comprises an organic layer dielectric layer.

7. The device of claim 6 wherein said planar capacitor laminate comprises a ceramic material filled organic dielectric layer, wherein the ceramic material of said layer has a dielectric constant of greater than 500.

8. The device of claim 1 wherein said planar capacitor laminate is a copper-dielectric-copper laminate.

9. The device of claim 8 wherein said copper-dielectric-copper laminate comprises one or more dielectric layers selected from an organic layer, a ceramic-filled organic layer, a ceramic layer, and mixtures thereof.

10. The device of claim 1 wherein the prepreg is an epoxy or a polymer resin.

11. The device of claim 1 wherein an additional circuit layer is laminated over the prepreg layer encapsulating the surface mount technology (SMT) discrete chip capacitor.

12. The device of claim 1 comprising more than one surface mount technology (SMT) discrete chip capacitor embedded in and encapsulated within said prepreg layer, wherein each of said surface mount technology (SMT) discrete chip capacitors:

comprises at least a first electrode and a second electrode, and said first electrode and second electrode of each said surface mount technology (SMT) discrete chip capacitor is connected to at least one power terminal of the semiconductor device;

is connected in parallel to said planar capacitor laminate such that said planar capacitor laminate serves as a low inductance path to supply a charge to said embedded surface mount technology (SMT) discrete chip capacitor; and is closer to power terminals of the semiconductor device than is said planar capacitor laminate to which said surface mount technology (SMT) discrete chip capacitor is connected in parallel.

* * * * *